(12) United States Patent
Spencer et al.

(10) Patent No.: US 6,940,153 B2
(45) Date of Patent: Sep. 6, 2005

(54) MAGNETIC SHIELDING FOR MAGNETIC RANDOM ACCESS MEMORY CARD

(75) Inventors: Andrew M. Spencer, Eagle, ID (US); Connie Lemus, Boise, ID (US); Colin Stobbs, Eagle, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/358,770

(22) Filed: Feb. 5, 2003

(65) Prior Publication Data

US 2004/0152261 A1 Aug. 5, 2004

(51) Int. Cl.[7] ............................................. H01L 23/552
(52) U.S. Cl. ................... 257/659; 257/294; 257/422; 257/435; 257/660
(58) Field of Search ........................... 257/91, 98, 294, 257/297, 323, 422, 435, 659, 660

(56) References Cited

U.S. PATENT DOCUMENTS

| | | | |
|---|---|---|---|
| 4,126,287 A | | 11/1978 | Mendelsohn et al. |
| 4,174,419 A | | 11/1979 | Nienart |
| 4,632,250 A | | 12/1986 | Ueda et al. |
| 4,670,347 A | * | 6/1987 | Lasik et al. ............... 428/458 |
| 4,884,235 A | | 11/1989 | Thiele |
| 5,045,637 A | | 9/1991 | Sato et al. |
| 5,061,845 A | * | 10/1991 | Pinnavaia ................ 235/492 |
| 5,260,128 A | | 11/1993 | Ishii et al. |
| 5,409,385 A | * | 4/1995 | Tan et al. ................ 439/76.1 |
| 5,565,704 A | * | 10/1996 | Tokuno ..................... 257/678 |
| 5,591,047 A | * | 1/1997 | Yamada et al. .......... 439/541.5 |
| 5,714,936 A | | 2/1998 | Regelsberger |
| 5,745,426 A | * | 4/1998 | Sekiyama ................ 365/226 |
| 5,902,690 A | | 5/1999 | Tracy et al. |
| 5,939,772 A | * | 8/1999 | Hurst et al. ............... 257/659 |
| 5,940,319 A | | 8/1999 | Durlam et al. |
| 6,404,647 B1 | | 6/2002 | Minne' |
| 6,429,044 B1 | * | 8/2002 | Tuttle ....................... 438/106 |
| 6,625,040 B1 | * | 9/2003 | Tuttle ....................... 361/816 |
| 6,661,071 B2 | * | 12/2003 | Lenssen et al. ............ 257/422 |
| 6,664,613 B2 | * | 12/2003 | Tuttle ....................... 257/659 |
| 2002/0116668 A1 | * | 8/2002 | Chhor et al. ................ 714/42 |
| 2003/0132494 A1 | * | 7/2003 | Tuttle et al. ............... 257/433 |

FOREIGN PATENT DOCUMENTS

| | | | |
|---|---|---|---|
| DE | 10103314 | 8/2002 | |
| JP | 63281980 A | * 11/1988 | .......... B65D/85/57 |
| JP | 63281980 | 11/1998 | |
| WO | WO 00/06271 | 2/2000 | |
| WO | WO 00/72324 | 11/2000 | |

OTHER PUBLICATIONS

Abstract of JP63281980.
Copy of full Search Report for United Kingdom Patent Application No. 0400870.2, mailed on Mar. 29, 2004.

* cited by examiner

Primary Examiner—Andy Huynh

(57) ABSTRACT

A memory card includes at least one magnetic random access memory supported by a substrate, and a memory card cover disposed over the magnetic random access memory and the substrate to form a memory card, wherein at least one of the substrate and the memory card cover includes magnetic shielding to at least partially shield the magnetic random access memory from external magnetic fields, the memory card cover forming an external portion of the memory card.

20 Claims, 11 Drawing Sheets

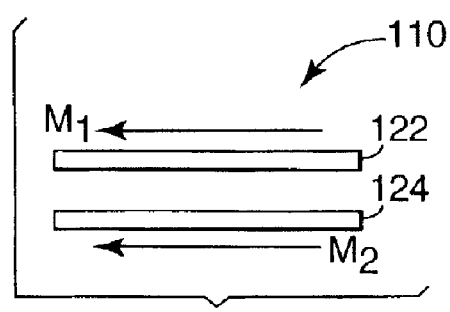 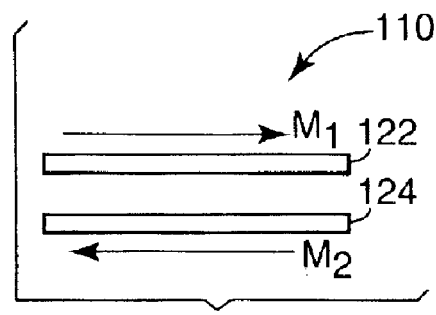
Fig. 2b            Fig. 2c
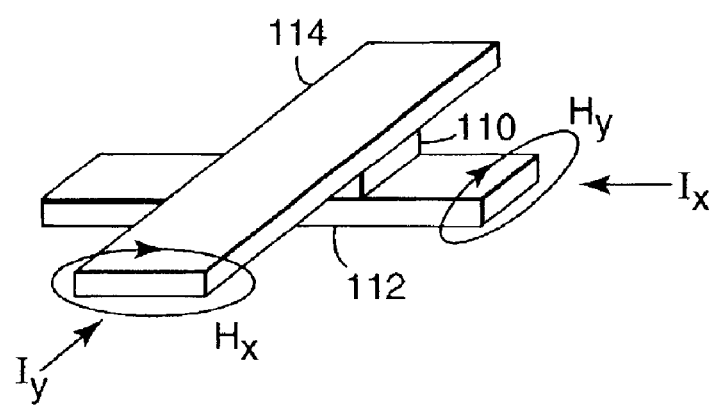
Fig. 3

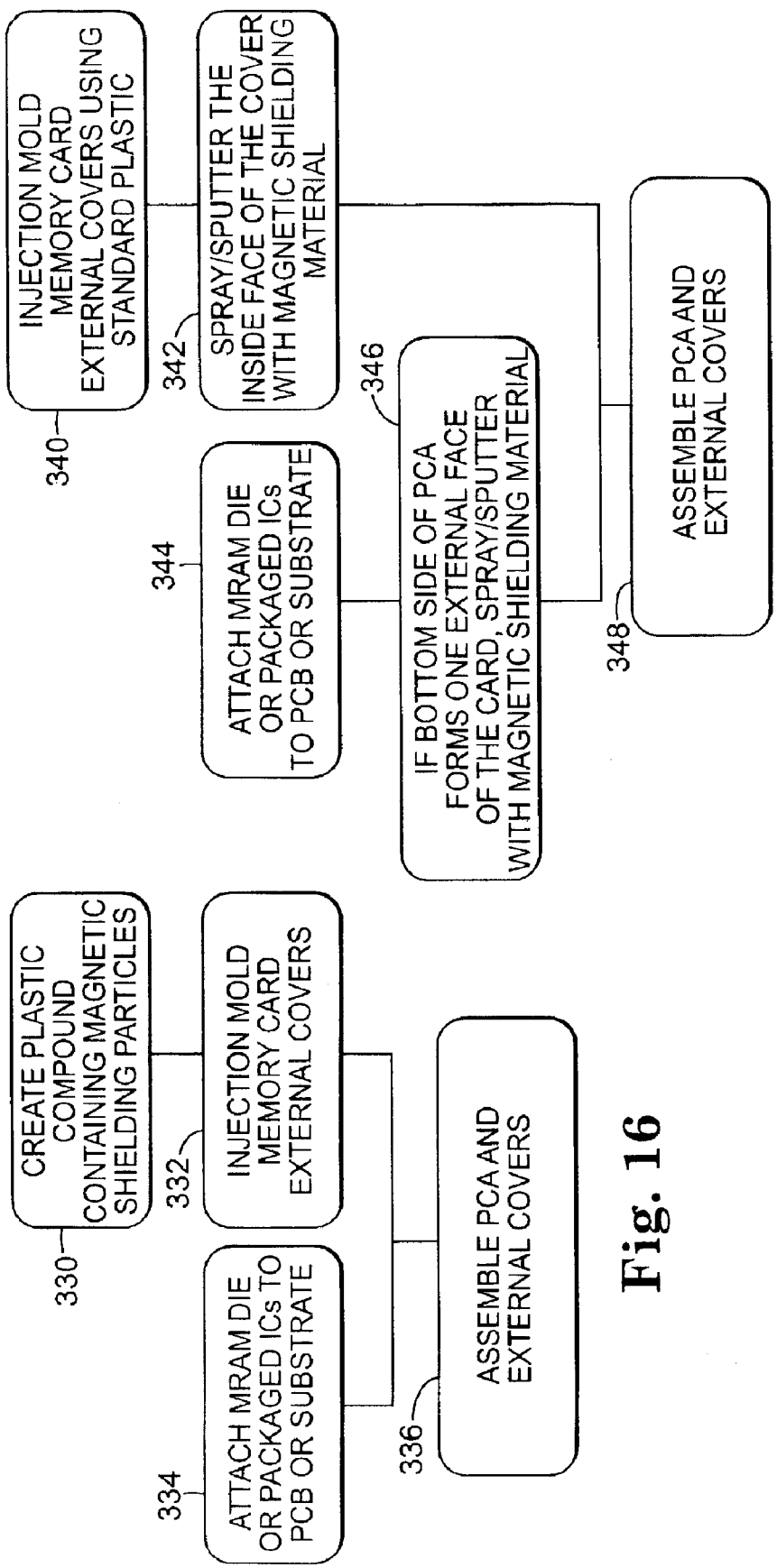

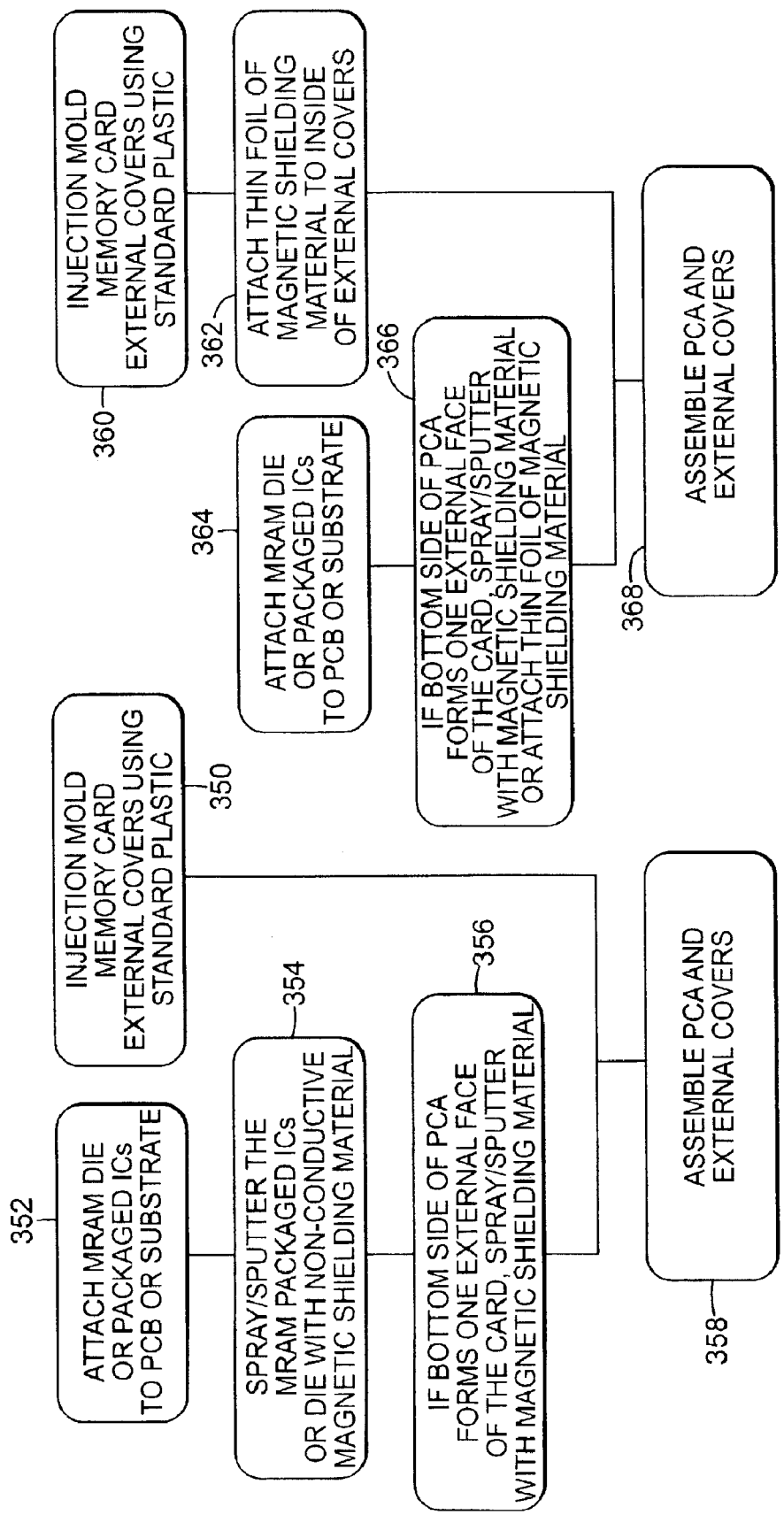

MAGNETIC SHIELDING FOR MAGNETIC RANDOM ACCESS MEMORY CARD

BACKGROUND OF THE INVENTION

A magnetic random access memory (MRAM) device includes an array of memory cells. The typical magnetic memory cell includes a layer of magnetic film in which the magnetization is alterable and a layer of magnetic film in which the magnetization is fixed or "pinned" in a particular direction. The magnetic film having alterable magnetization is referred to as a data storage layer or sense layer, and the magnetic film that is pinned is referred to as a reference layer.

Conductive traces (commonly referred to as word lines and bit lines) are routed across the array of memory cells. Word lines extend along rows of memory cells, and bit lines extend along columns of memory cells. Because the word lines and bit lines operate in combination to switch the orientation of magnetization of the selected memory cell (i.e., to write the memory cell), the word lines and bit lines are referred to collectively as write lines. Additionally, the write lines are used to read the logic values stored in the memory cell.

Located at each intersection of a word line and a bit line is a memory cell. Each memory cell stores a bit of information as an orientation of a magnetization. The orientation of magnetization of each memory cell will assume one of two stable orientations at any given time. These two stable orientations represent logic values of "1" and "0".

The orientation of magnetization of a selected memory cell is changed by the application of an external magnetic field. Supplying electrical current to a word line and a bit line that intersect at the selected memory cell creates the external magnetic field. The electrical currents in the word and bit lines create magnetic fields (also referred to as "write fields") surrounding the energized word and bit lines that, when combined, can switch the orientation of magnetization (and thus the logic value) of the selected memory cell. Because no electric power is needed to maintain the memory state of the device, MRAMs are non-volatile.

Generally, only the selected magnetic memory cell is subjected to both the word and bit line write fields. Other memory cells coupled to the particular word line generally receive only the word line write field. Other magnetic memory cells coupled to the bit line generally receive only the bit line write field.

The magnitudes of the word and bit line write fields are usually selected to be high enough so that the chosen magnetic memory cell switches its logic state when subjected to both fields, but low enough so that the other magnetic memory cells that are subject only to a single write field (from either the word line or the bit line) do not switch. The undesirable switching of a magnetic memory cell that receives only one write field is commonly referred to as "half-select" switching.

One issue encountered by MRAM devices is the presence of stray or external magnetic fields that emanate from sources other than the word and bit lines that are intended to write to a particular memory cell. Stray magnetic fields can originate from a multitude of sources, e.g. external electronic devices such as computers, displays, bar code readers, etc. In many instances, stray magnetic fields may have a magnitude sufficient to switch the logic state of a memory cell, either as half-select switching or switching in the absence of a write field. Thus, use of MRAM in magnetic field-rich environments typically has been considered susceptible to unacceptable error.

The effect of stray fields increases as the storage density of MRAM devices increases. As memory cells are packed closer together, the magnetic fields from adjacent memory cells and their associated write conductors exert a greater effect. Additionally, small form factors reduce or eliminate the ability to include magnetic shielding e.g. within integrated circuit packages in which MRAM is disposed.

SUMMARY OF THE INVENTION

A memory card includes at least one magnetic random access memory supported by a substrate, and a memory card cover disposed over the magnetic random access memory and the substrate to form a memory card, wherein at least one of the substrate and the memory card cover comprises magnetic shielding to at least partially shield the magnetic random access memory from external magnetic fields, the memory card cover forming an external portion of the memory card.

BRIEF DESCRIPTION OF THE DRAWINGS

Embodiments of the invention are better understood with reference to the following drawings. The elements of the drawings are not necessarily to scale relative to each other. Like reference numerals designate corresponding similar elements.

FIGS. 2a–2c illustrate the orientations of magnetization of active and reference magnetic films of a magnetic memory cell like that in FIGS. 1a and 1b.

FIG. 3 is a perspective view of a memory cell like that in FIGS. 1a and 1b, showing magnetic fields generated by currents flowing through the write lines.

FIGS. 13–19 are flow diagrams according to embodiments of the invention.

DETAILED DESCRIPTION

Figure 1A:
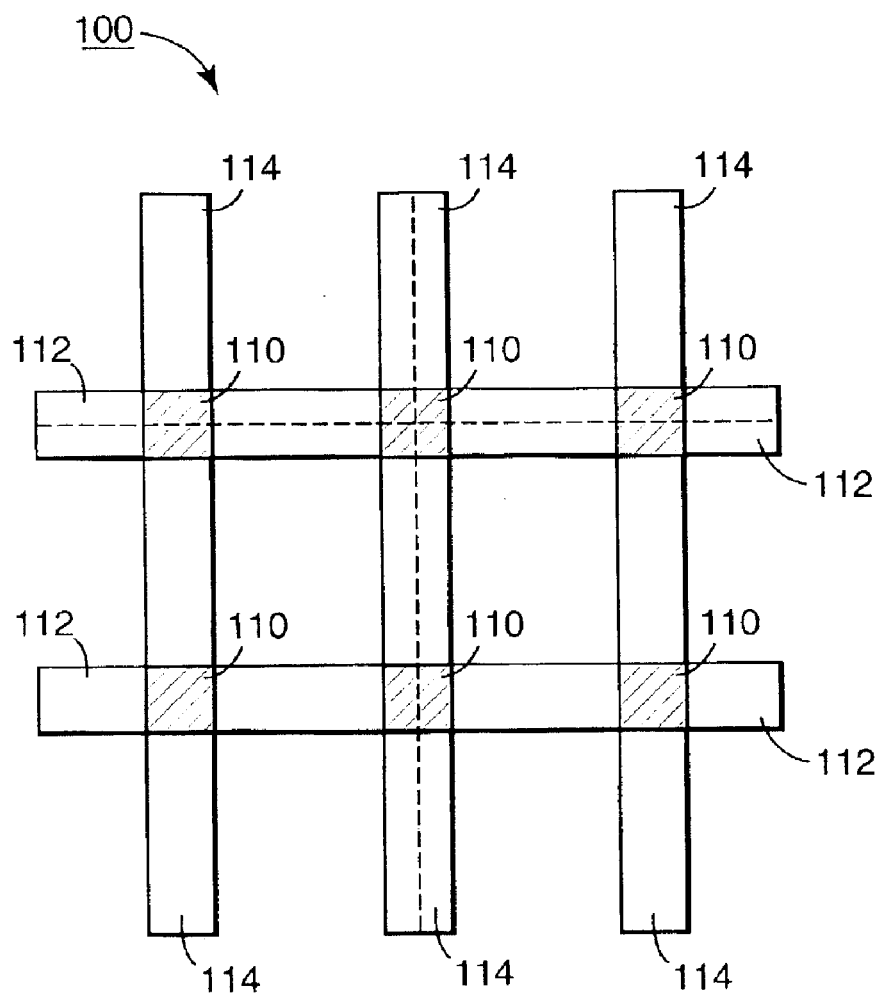
FIGS. 1a and 1b are top and perspective views of an embodiment of a simplified magnetic memory array.
Figure 1B:
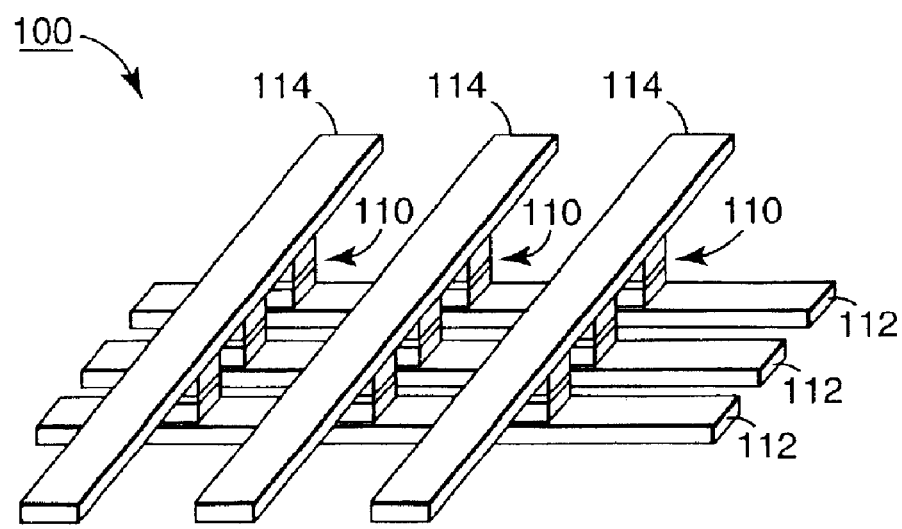

FIGS. 1a–1b show top plan and perspective views of an embodiment of a simplified MRAM array 100. MRAM array 100 includes memory cells 110, word lines 112, and bit lines 114. Memory cells 110 are positioned at each intersection of a word line 112 with a bit line 114. Word lines 112 and bit lines 114 are write lines arranged in orthogonal relation to one another, and memory cells 110 are positioned between write lines 112, 114, as illustrated in FIG. 1b. For example, bit lines 114 are positioned above memory cells 110 and word lines 112 are positioned below memory cells 110.

Figure 2A:
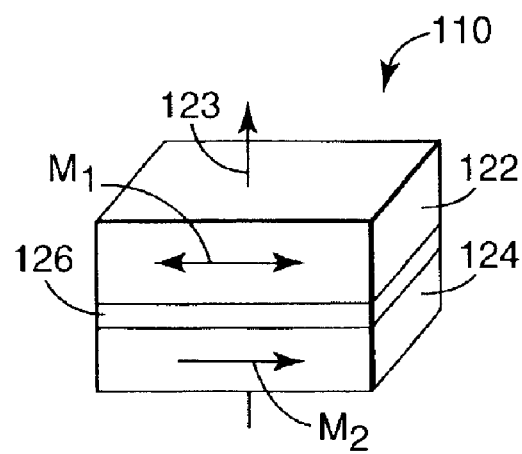

FIGS. 2a–2c illustrate storage of a bit of data in a single memory cell 110. In FIG. 2a, memory cell 110 includes active magnetic data film 122 (the sense layer) and pinned magnetic film 124 (the reference layer), which are separated by dielectric region 126 (the tunnel barrier). The orientation of magnetization in sense layer 122 is not fixed and assumes two stable orientations, as shown by arrow $M_1$. On the other hand, pinned reference layer 124 has a fixed orientation of magnetization, as shown by arrow $M_2$. Sense layer 122 rotates its orientation of magnetization in response to electrical currents applied to write lines 112, 114 during a write operation to the selected memory cell 110.

The first logic state of the data bit stored in memory cell 110 is indicated when $M_1$ and $M_2$ are oriented in the same direction, or "parallel", as illustrated in FIG. 2b. For instance, when $M_1$ and $M_2$ are oriented in the same direction, a logic "1" state is stored in the memory cell 110. Conversely, a second logic state is indicated when $M_1$ and $M_2$ are oriented in opposite directions, or "anti-parallel", as illustrated in FIG. 2c. Similarly, when $M_1$ and $M_2$ are oriented in opposite directions, a logic "0" state is stored in memory cell 110. In FIGS. 2b and 2c, dielectric region 126 is omitted for clarity. Although FIGS. 2a–2c illustrate sense layer 122 positioned above reference layer 124, reference layer 124 may be positioned above sense layer 122.

The resistance of memory cell 110 differs according to the orientations of $M_1$ and $M_2$. When $M_1$ and $M_2$ are oriented in opposite directions, i.e., the logic "0" state, the resistance of memory cell 110 is at its highest. On the other hand, the resistance of memory cell 110 is at its lowest when the orientations of $M_1$ and $M_2$ are parallel, i.e., the logic "1" state. As a consequence, the logic state of the data bit stored in memory cell 110 may also is determined by measuring its resistance. The resistance of memory cell 110 is reflected by a magnitude of a sense current 123 (FIG. 2a) that flows in response to read voltages applied to write lines 112, 114.

The memory cell structure shown in FIG. 2a may also is referred to as a spin-tunneling device, in that electrical charge migrates through the tunnel barrier during read operations. This electrical charge migration through the tunnel barrier is due to a phenomenon called spin tunneling and occurs when a read voltage is applied to a magnetic memory cell.

In FIG. 3, memory cell 110 is positioned between write lines 112, 114. For clarity, sense and reference layers 122, 124 are not shown in FIG. 3. The orientation of magnetization of sense layer 122 is rotated in response to current $I_x$ that generates magnetic field $H_y$, and current $I_y$ that generates magnetic field $H_x$. Magnetic fields $H_x$ and $H_y$ act in combination to rotate the orientation of magnetization of sense layer 122 in memory cell 110.

Each memory cell 110 has a switching characteristic for sense layer 122. That is, a magnetic field having a minimum magnitude equal to $H_s$ is needed to flip the orientation of magnetization of sense layer 122 between its parallel and anti-parallel orientations shown in FIGS. 2b and 2c. In designing an MRAM device, the magnitudes of the $H_x$ and $H_y$ fields are preselected, so that the resulting field $H_w$ has a magnitude that is greater than or equal to the magnitude $H_s$ needed to write to the magnetic memory cell 110 (that is, to alter the orientation of magnetization of sense layer 122). The magnitudes of the $H_x$ and $H_y$ fields may also are slightly larger than necessary to yield the $H_w$ field, to provide a "write margin" in excess of $H_s$.

In practice, the switching characteristic of each memory cell 110 varies among the magnetic memory cells in the array, due to manufacturing variations. In addition, the switching characteristic is such that lower magnitudes of the $H_x$ or $H_y$ fields cause switching in magnetic memory cells in the presence of a perpendicular field. This characteristic is due to a variety of factors, such as manufacturing variations in the crystalline anisotropy value ($H_k$) of the sense layers of the magnetic memory cells, or variations in the thickness or shape of the magnetic layers of the magnetic memory cells. For example, photolithography processes potentially yield rounded edges, rather than rectangular edges, on the data storage layers. Moreover, data storage layers having square rather than rectangular shapes potentially have significantly different switching characteristics.

The issues produced in MRAM devices by the presence of stray or external magnetic fields can be appreciated by recognizing that the orientation of magnetization of sense layer 122 potentially is switched when the total magnetic field to which the memory cell is subjected exceeds $H_s$. In some instances, stray magnetic fields potentially have a magnitude sufficient to switch the logic state of a memory cell when combined only with $H_x$ or $H_y$. Certain stray magnetic fields potentially also exceed $H_s$ on their own, and switch the logic state of a memory cell in the absence of a write field $H_x$ or $H_y$. Thus, reducing or eliminating the effects of stray magnetic fields becomes increasingly of interest, especially as memory cells shrink in size and the storage densities of memory arrays increase. Such effects are potentially heightened, for example, when MRAM is placed in a device having a form factor of an insertable card, e.g. an industry-specific standard memory card or other insertable or modular memory device in a card-type form factor. Thus, according to embodiments of the invention, the effect of stray external magnetic fields is reduced or eliminated by providing magnetic shielding for magnetically sensitive storage or memory devices such as MRAM, particularly MRAM disposed in a memory card form factor, for example.

Figure 4:
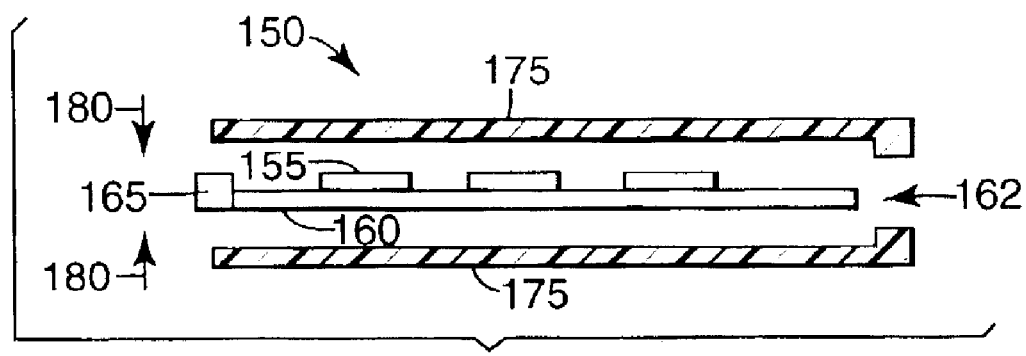
FIG. 4 is a partially-exploded, cross-sectional view of a memory card according to an embodiment of the invention.

FIG. 4 is a partially-exploded view of memory card 150 according to an embodiment of the invention. One or more surface-mount integrated circuit (IC) packages 155 contain MRAM die, e.g. as described with reference to FIGS. 1–3. Packages 155 are mounted on substrate 160, which may be a printed circuit board, for example. According to additional embodiments, MRAM die, packages or chips are direct-die attached to board 160. Together, board 160 and package(s) 155 make up printed circuit assembly 162. Input/output connector 165, which optionally is a separate connector or is a part of printed circuit board 160, electrically connects printed circuit assembly 162 to any of the many possible hosts or other devices adapted to receive memory card 150. One or more external card covers 175 are disposed on opposite sides of printed circuit assembly 162 and are attached together, as represented by arrows 180, using e.g., pressure, adhesive, screws and/or other fasteners, heat staking, low amounts of heat and/or other mechanical or other fixturing techniques.

Magnetic shielding according to embodiments of the invention is applied to or incorporated into one or more of cover(s) 175 and printed circuit assembly 162. Magnetic shielding also optionally is used within e.g. integrated circuit packages 155. Magnetic shielding according to embodiments of the invention is chosen from any of a number of shielding materials and may also provides a permeability higher than that of air or silicon, for example. One type of magnetic shielding comprises magnetic particles, threads or other structures or forms (collectively herein, "particles") that are incorporated into or sprayed/sputtered onto the cover(s) 175 and/or printed circuit assembly 162. Such particles are formed of any of a variety of materials, e.g., iron, nickel, iron-nickel alloy, iron-nickel-molybdenum alloy, and other materials. Such particles may be incorporated into a supporting material, such as a polyimide or glass-sealing alloy, for example, for spraying or sputtering. Other types of magnetic shielding include electrically non-conductive materials, e.g. non-conductive magnetic oxides such as the ferrites $MnFe_2O_4$, $FeFe_2O_4$, $CoFe_2O_4$, $NiFe_2O_4$, $CuFe_2O_4$, or $MgFe_2O_4$. Cobaltites, chromites, manganites and other materials are also contemplated, as are one or more foil layers incorporating one or more of the above-described or other shielding materials. Various commercially-available shielding materials also are contemplated for use according to embodiments of the invention, e.g., ferromagnetic shielding materials generally, specific shielding materials sold under the trademarks MUMETAL, PERMALLOY, etc., and others. Both conductive and non-conductive shielding materials are contemplated, depending e.g., on proximity to integrated circuit packages or other electronics in the finished memory card. The specific materials and forms of application are chosen according to the properties of the specific card 150.

Figure 5A:
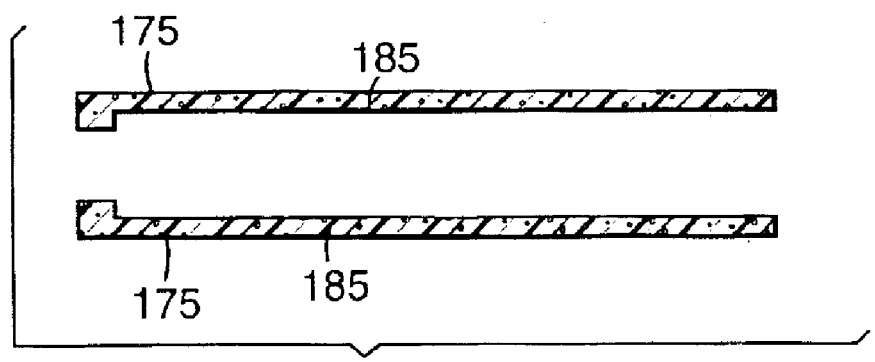
FIGS. 5a and 5b are cross-sectional views of a memory card cover according to embodiments of the invention.
Figure 5B:
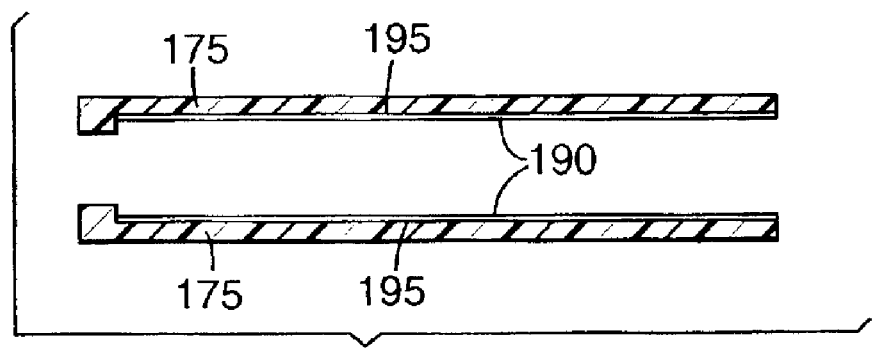

FIG. 5a shows one embodiment of shell or covering 175 of card 150, in which magnetic shielding particles 185 are incorporated. For example, particles 185 may be originally disposed in a plastic compound from which covering 175 is injection-molded. Other materials for covering 175 are contemplated, e.g. metal, as are other methods of manufacture, e.g. stamping, cutting, etc. FIG. 5b shows another embodiment, in which magnetic shielding material 190 is sprayed, sputtered, or otherwise applied to an interior surface 195 of covering 175. Magnetic shielding material 190 may alternatively be disposed in one or more layers of foil disposed on interior surface 195, for example, and secured thereto by adhesive or other securing agent or device. According to embodiments of the invention, a printed circuit assembly is positionable within covering 175 of FIGS. 5a and 5b to form a memory card.

Figure 6A:
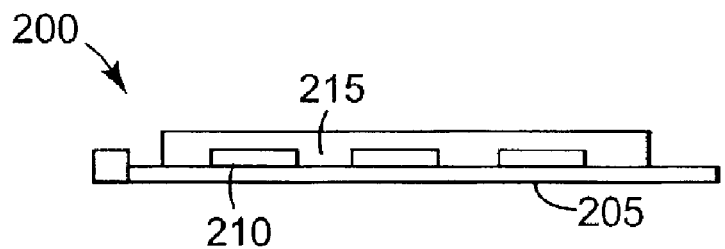
FIGS. 6a and 6b are side views of an embodiment of a printed circuit assembly for a memory card.
Figure 6B:
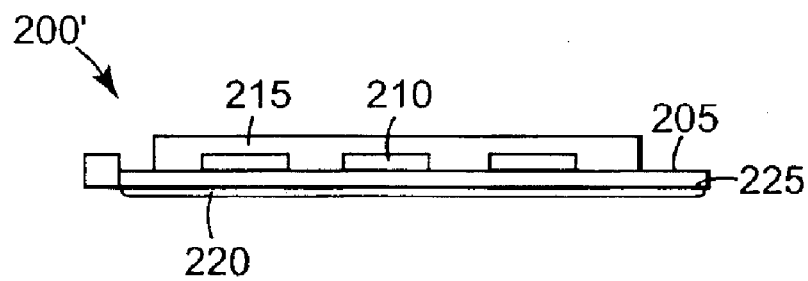
Figure 6C:
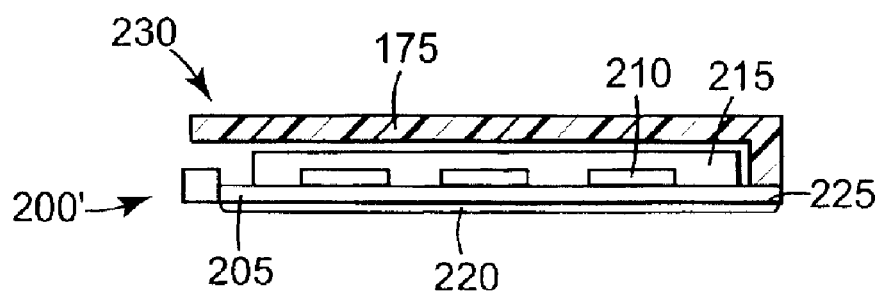
FIG. 6c is a cross-sectional view of a memory card according to an embodiment of the invention.

FIG. 6a illustrates printed circuit assembly 200, including board or other substrate 205 and at least one MRAM device 210, such as chips, dies or IC packages. Non-conductive shielding material 215 is sputtered, sprayed, or otherwise directly applied to and around at least one device 210 attached to board 205. Such material 215 includes non-conductive shielding particles or is another type of shielding material described previously herein. Such embodiments are particularly advantageous when devices 210 are attached using, for example, a flip-chip or wire-bond technique, and there is little or no opportunity to incorporate shielding directly within individual IC packages or other devices. Printed circuit assembly 200 then may be incorporated into at least one covering 175 that is free of shielding, or such covering(s) that include magnetic shielding in the manner of FIGS. 5a–5b, for example. According to the FIG. 6b embodiment, printed circuit assembly 200' alternatively, or additionally, includes layer 220 of shielding material applied to a side 225 of board 205 opposite MRAM devices 210. As shown in FIG. 6c, upon assembly into the form factor of a card 230, layer 220 on side 225 of board 205 itself forms an external surface of card 230. Alternatively, printed circuit assembly 200' may also is disposed entirely within one or more coverings 175, such that shielding layer 220 is inside covering 175.

Thus, embodiments of the invention provide memory card 150 or 230, for example, comprising substrate 160, 205, magnetic random access memory 155, 210 supported by substrate 160, 205, and memory card cover 175 disposed over the magnetic random access memory and the substrate to form the memory card. At least one of substrate 160, 205 and memory card cover 175 comprises magnetic shielding 185, 190, 215, and/or 220, for example, to shield the magnetic random access memory from external magnetic fields. Memory card cover 175 forms an external portion of the memory card. Substrate 160, 205 comprises, e.g., a printed circuit board. For example, the magnetic random access memory is packaged in at least one surface-mount integrated circuit package 155 mounted on the printed circuit board, and/or is disposed in at least one die directly attached to the printed circuit board.

The magnetic random access memory may comprise a plurality of magnetic random access memory devices 210. The magnetic shielding may comprise a generally continuous layer of magnetic shielding material 215 sprayed or sputtered over the plurality of magnetic random access memory devices 210. The magnetic shielding may also comprise magnetic shielding material 190 sprayed or sputtered onto the memory card cover 175, and/or disposed in or as a foil layer disposed on memory card cover 175. Further, the magnetic shielding may also comprise magnetic shielding particles 185 embedded in memory card cover 175, and/or magnetic shielding material 215 and/or 220 sprayed or sputtered onto substrate 205, to form an external surface of the memory card.

Embodiments of the invention also include memory card 150, 230 comprising magnetic memory means 155 and/or 210, e.g. magnetic random access memory, means 175 and/or 205 for covering magnetic memory 155, 210, the means for covering forming an external portion of the memory card, and means 185, 190, 215 and/or 220 for shielding the magnetic memory from external magnetic fields, the means for shielding being disposed in or on the means for covering. Means 205 for covering may comprise a printed circuit board and means 215, 220 for shielding may comprise magnetic shielding material sprayed or sputtered on the printed circuit board. Means 175 for covering further may comprise a memory card case, e.g. a plastic memory card case, connected to the printed circuit board.

Figure 7:
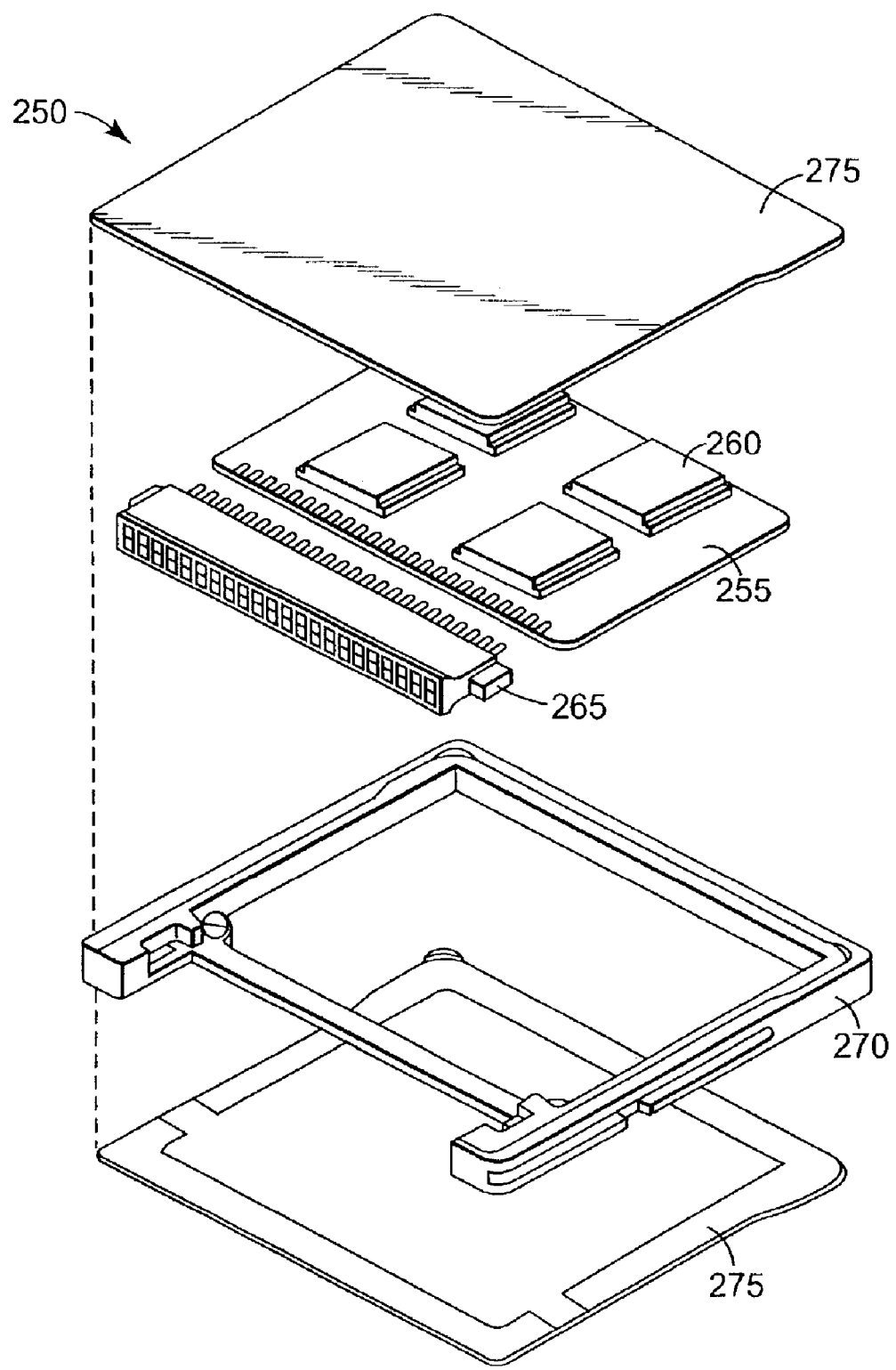
FIG. 7 is an exploded perspective view of a memory card according to an embodiment of the invention.
Figure 8:
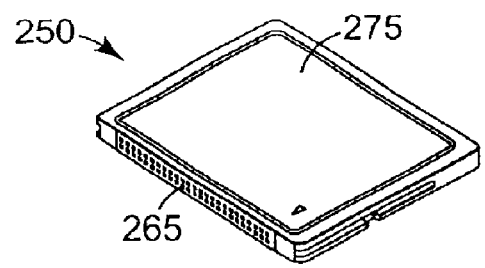
FIGS. 8–12 are perspective views of memory card form factors, according to embodiments of the invention.

A wide variety of memory card form factors are contemplated, according to embodiments of the invention. FIG. 7 shows one such form factor. Card 250, which may also is in the manner of a COMPACTFLASH brand card, includes printed circuit assembly 255, one or more high-density storage devices 260, such as the MRAM devices described previously, and connector 265. This particular card 250 also comprises internal frame 270 and outer plates 275, which individually or together are covers that generally enclose printed circuit assembly 255. According to embodiments of the invention, magnetic shielding is incorporated into or on outer plates 275 in the manner of, e.g., FIG. 5a or 5b. Printed circuit assembly 255 may also include magnetic shielding on one or both sides thereof, e.g., in the manner of FIG. 6a or 6b. FIG. 8 shows assembled card 250.

Figure 9:
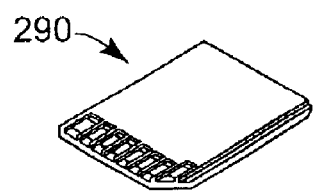
Figure 10:
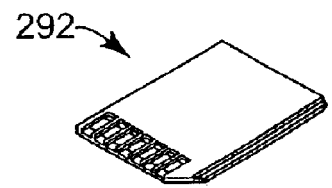
Figure 11:
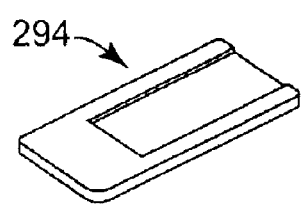
Figure 12:
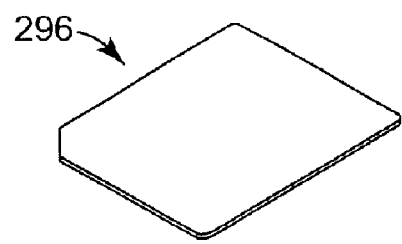

Additional examples of memory card form factors useable according to embodiments of the invention are shown in FIGS. 9–12. FIG. 9 shows Secure Digital card format 290, FIG. 10 shows MULTIMEDIACARD brand card format 292, FIG. 11 shows MEMORY STICK brand card format 294, and FIG. 12 shows SMARTMEDIA brand card format 296. A wide variety of card dimensions are contemplated according to embodiments of the invention, including standard disk drive formats of e.g. about 2.5 inches or about 3.5 inches. Memory cards according to embodiments of the invention are useable with a wide variety of host devices, including computers, digital cameras, cellular telephones and other wireless communication devices, personal digital assistants, etc.

Figure 13:
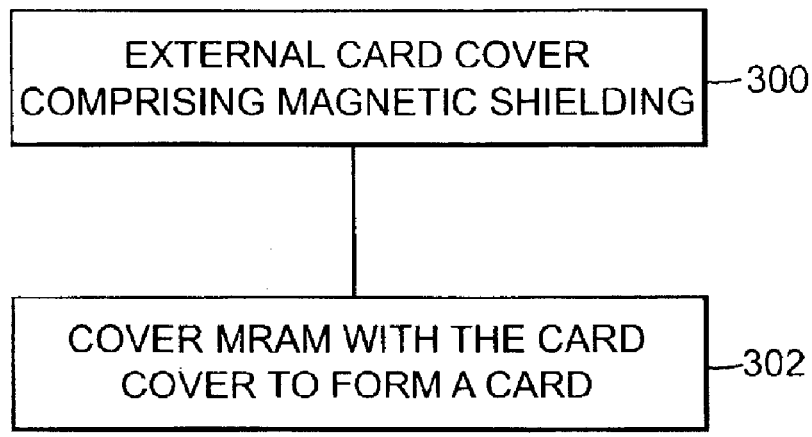

According to embodiments of the invention, a method of packaging magnetic random access memory includes, at 300 in FIG. 13, providing an external card cover comprising magnetic shielding, and, at 302, covering magnetic random access memory with the external card cover to form a card, the external card cover shielding the magnetic random access memory from external magnetic fields. Providing 300 may also comprise molding a compound comprising magnetic shielding material to form the external card cover, molding a plastic compound comprising magnetic shielding particles to form the external card cover, spraying, sputtering or vapor depositing an inside face of the external card cover with magnetic shielding material, and/or attaching a thin foil of magnetic shielding material to an inside face of the external card cover. Providing 300 also may comprise providing two external card cover portions. Covering 302 may also comprises disposing the card cover portions on opposite sides of the magnetic random access memory to form the card.

Figure 14:
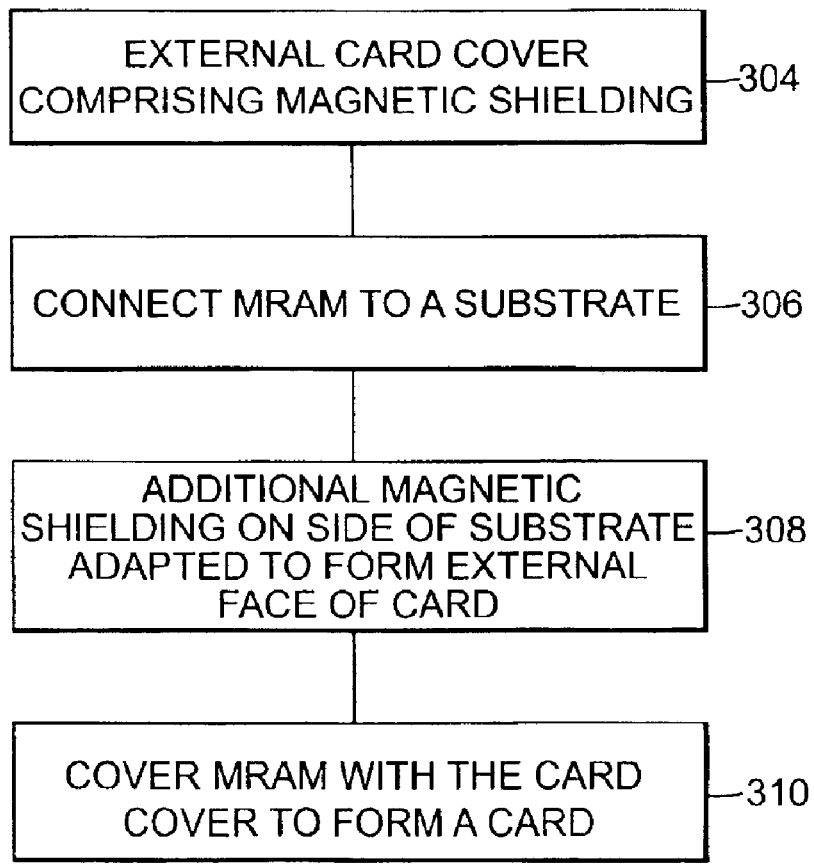

As shown in FIG. 14, according to embodiments of the invention, a method of packaging magnetic random access memory includes, at 304, providing an external card cover comprising magnetic shielding. The magnetic random access memory is connected to a substrate, at 306, one side of the substrate being adapted to form an external face of the card. At 308, the method provides additional magnetic shielding on the side of the substrate adapted to form the external face of the card. At 310, the magnetic random access memory is covered with the external card cover to form a card, the external card cover shielding the magnetic random access memory from external magnetic fields. Providing 308 may also comprise spraying, sputtering or vapor depositing magnetic shielding material on the side of the substrate adapted to form the external face of the card and/or connecting a thin foil of magnetic shielding material to the side of the substrate adapted to form the external face of the card.

Figure 15:
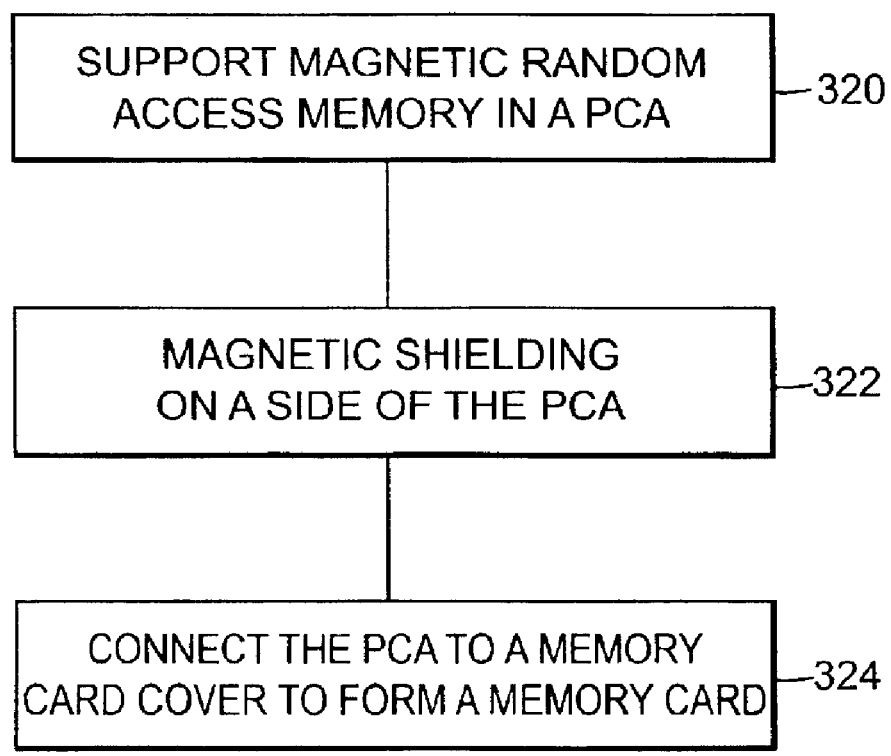

According to additional embodiments of the invention, a method of forming a memory card as illustrated in FIG. 15 includes, at 320, supporting magnetic random access memory in a printed circuit (PCA) assembly, providing magnetic shielding on a side of the printed circuit assembly, at 322, and connecting, at 324, the printed circuit assembly to a memory card cover to form the memory card, wherein the side of the printed circuit assembly on which the magnetic shielding is provided forms an external portion of the memory card. Providing 322 may optionally comprise spraying, sputtering or vapor depositing magnetic shielding material on a side of the printed circuit assembly, and/or connecting a thin foil of magnetic shielding material on a side of the printed circuit assembly. Connecting 324 optionally comprises connecting the printed circuit assembly to a memory card cover comprising additional magnetic shielding, wherein the magnetic shielding of the memory card cover and the magnetic shielding of a side of the printed circuit assembly both shield the magnetic random access memory from external magnetic fields. Supporting 322 may further comprise supporting a plurality of magnetic random access memory devices in the printed circuit assembly, the method further comprising spraying or sputtering additional magnetic shielding over the plurality of magnetic random access memory devices.

According to an additional method embodiment illustrated in FIG. 16, a plastic compound containing magnetic shielding particles is created, at 330. One or more memory card external covers are injection-molded from the plastic compound, at 332. MRAM die or MRAM-packaged integrated circuits are attached to a substrate, at 334, to form a PCA, and the PCA is assembled with the external cover(s) using adhesive, heat and/or temperature or other mechanisms, at 336.

FIG. 17 illustrates an additional method embodiment, in which one or more memory card external covers are injection-molded using standard plastic, at 340. At 342, at least one inside face of one or more of the covers is sprayed, sputtered or vapor deposited with magnetic shielding material. MRAM die or MRAM-packaged integrated circuits are attached to a substrate, at 344, to form a PCA. If a side, e.g. a bottom side, of the PCA forms an external face of the card, the face is sprayed, sputtered or vapor deposited with magnetic shielding material, at 346. Injection-molding of shielding material also is contemplated. At 348, the PCA is assembled with the external cover(s) using adhesive, heat and/or temperature, or other mechanisms.

According to the FIG. 18 embodiment, one or more memory card external covers are injection-molded using standard plastic, at 350. MRAM die or MRAM-packaged integrated circuits are attached to a substrate, at 352, to form a PCA. The MRAM-packaged ICs or dies are sprayed or sputtered with non-conductive magnetic shielding material, at 354. If a side, e.g. a bottom side, of the PCA forms an external face of the card, the face is sprayed, sputtered or vapor deposited with magnetic shielding material, at 356. Injection-molding of shielding material also is contemplated. At 358, the PCA is assembled with the external cover(s) using adhesive, heat and/or temperature or other mechanisms.

According to the FIG. 19 embodiment, one or more memory card external covers are injection-molded using standard plastic, at 360. At 362, a thin foil of magnetic shielding material is attached to the inside of the external cover(s). MRAM die or MRAM-packaged integrated circuits are attached to a substrate, at 364, to form a PCA. If a side, e.g. a bottom side, of the PCA forms an external face of the card, the face is sprayed, sputtered or vapor deposited with magnetic shielding material and/or a thin foil of magnetic shielding material is attached to the face, at 366. Injection-molding of shielding material also is contemplated. At 368, the PCA is assembled with the external cover(s) using adhesive, heat and/or temperature. Other methods are contemplated according to embodiments of the invention.

What is claimed is:

1. A memory card, comprising:
    at least one magnetic random access memory supported by a substrate;
    a memory card cover disposed over the magnetic random access memory and the substrate to form the memory card; and
    an input/output connector electrically coupled with the magnetic random access memory and supported by the substrate, the connector forming an edge of the memory card and being adapted to connect the memory card to a device for receiving the memory card;
    wherein at least one of the substrate and the memory card cover comprises magnetic shielding to at least partially shield the magnetic random access memory from external magnetic fields, the memory card cover forming an external portion of the memory card;
    wherein the connector forms a first edge of the memory card; further wherein the memory card cover defines a second edge of the memory card opposite the first edge.

2. The memory card of claim 1, wherein the substrate comprises a printed circuit board.

3. The memory card of claim 1, wherein the magnetic shielding comprises a generally continuous layer of magnetic shielding material applied over the at least one magnetic random access memory device.

4. The memory card of claim 1, wherein the magnetic shielding comprises magnetic shielding material applied to the memory card cover.

5. The memory card of claim 1, wherein the magnetic shielding comprises a foil layer of magnetic shielding material.

6. The memory card of claim 1, wherein the magnetic shielding comprises magnetic shielding particles embedded in the memory card cover.

7. The memory card of claim 1, wherein the magnetic shielding comprises magnetic shielding material applied onto the substrate.

8. The memory card of claim 1, wherein the magnetic shielding comprises magnetic shielding material applied onto the substrate to form an external surface of the memory card.

9. The memory card of claim 1, wherein the substrate is recessed within the memory card relative to the connector.

10. The memory card of claim 1, wherein the connector is bordered on opposite sides thereof by the memory card cover.

11. The memory card of claim 1, wherein the memory card cover comprises two memory card cover portions formed as separate pieces, the connector being bordered on one side thereof by one of the memory card cover portions and on the opposite side thereof by the other memory card cover portion, wherein an edge of the connector extends from said one memory card cover portion to the other memory card cover portion, further wherein said connector edge is generally coplanar with outer edges of the memory card cover portions; further wherein the connector is at least partially recessed within the memory card cover portions.

12. The memory card of claim 1, wherein the connector is adapted to readily removably electrically connect the memory card to multiple host devices.

13. The memory card of claim 1, wherein the memory card cover comprises two memory card cover portions formed as separate pieces; further wherein the memory card comprises an internal frame supporting and spacing apart the memory card cover portions, the internal frame further defining a recess for accommodating the connector.

14. A memory card, comprising:

magnetic memory;

means for covering the magnetic memory, the means for covering forming an external portion of the memory card;

means for shielding the magnetic memory from external magnetic fields, the means for shielding being disposed in the means for covering and being deposited on and around the magnetic memory; and means for electrically connecting the magnetic memory to multiple host devices adapted to receive the memory card, the means for electrically connecting forming an edge of the memory card.

15. The memory card of claim 14, wherein the means for covering comprises a printed circuit board and the means for shielding comprises magnetic shielding material applied on the printed circuit board.

16. The memory card of claim 15, wherein the means for covering further comprises a memory card case connected to the printed circuit board.

17. The memory card of claim 14, wherein the means for covering comprises a plastic memory card case.

18. The memory card of claim 14, wherein the magnetic memory means comprises magnetic random access memory.

19. The memory card of claim 14, wherein the means for electrically connecting forms an edge of the memory card bordered on opposite sides thereof by the means for covering.

20. The memory card of claim 14, wherein the magnetic memory is one of a plurality of magnetic memories; further wherein the means for shielding is sprayed or sputtered on and between the plurality of magnetic memories.

* * * * *